(12) United States Patent
Hauser et al.

(10) Patent No.: US 6,521,988 B2
(45) Date of Patent: Feb. 18, 2003

(54) DEVICE FOR PACKAGING ELECTRONIC COMPONENTS

(75) Inventors: Christian Hauser, Regensburg (DE); Johann Winderl, Wackersdorf (DE); Jens Pohl, Bernhardswald (DE)

(73) Assignee: Infineon Technologies AG, München (DE)

(*) Notice: Subject to any disclaimer, the term of this patent is extended or adjusted under 35 U.S.C. 154(b) by 0 days.

(21) Appl. No.: 09/816,929

(22) Filed: Mar. 23, 2001

(65) Prior Publication Data
US 2001/0045641 A1 Nov. 29, 2001

(30) Foreign Application Priority Data
Mar. 23, 2000 (DE) .......................... 100 14 380

(51) Int. Cl.$^7$ .............................................. H01L 23/48
(52) U.S. Cl. ................... 257/697; 257/678; 257/680; 257/690; 257/697; 257/738; 257/778
(58) Field of Search ................. 257/678, 680, 257/690, 697, 738, 778, 780, 784

(56) References Cited

U.S. PATENT DOCUMENTS

| | | | |
|---|---|---|---|
| 5,023,202 A | 6/1991 | Long et al. | 437/206 |
| 5,467,253 A | 11/1995 | Heckman et al. | 361/761 |
| 5,990,545 A | * 11/1999 | Schueller et al. | 257/678 |
| 6,200,121 B1 | * 3/2001 | Tsuruta | 257/724 |
| 6,300,685 B1 | * 10/2001 | Hasegawa et al. | 257/680 |

FOREIGN PATENT DOCUMENTS

| | | |
|---|---|---|
| EP | 0 664 562 A1 | 7/1995 |
| JP | 11 219 959 A | 8/1999 |

* cited by examiner

Primary Examiner—David Nelms
Assistant Examiner—Mai-Huong Tran
(74) Attorney, Agent, or Firm—Laurence A. Greenberg; Werner H. Stemer; Ralph E. Locher

(57) ABSTRACT

The invention relates to a device and a method for packaging electronic components (11) having semiconductor chips (5) by means of a mounting frame (1), which is additionally provided with a plastic grid (6) that is disposed on a plastic intermediate substrate (2), which surrounds each semiconductor chip (5) in framelike fashion and which for packaging the plurality of semiconductor chips (5) with a plastic casting composition (7) between semiconductor chips (5) and the plastic grid (6).

10 Claims, 6 Drawing Sheets

DEVICE FOR PACKAGING ELECTRONIC COMPONENTS

BACKGROUND OF THE INVENTION

Field of the Invention

The invention relates to a device for packaging electronic components and to a method for packaging electronic components.

One way of packaging electronic components is known as the BGA (ball grid array) housing. The device for packaging electronic components in BGA housings has a mounting frame, which frames and retains a plastic intermediate substrate. The plastic intermediate substrate has a plurality of contact bumps with connected conductor tracks that lead to a plurality of semiconductor positions inside the associated mounting frame. At these semiconductor chip positions, semiconductor chips are mounted, whose contact faces are connected to the conductor tracks of the plastic intermediate substrate. At the same time, plastic spacers or spacing layers assure that the semiconductor chips are retained on the plastic intermediate substrate at the semiconductor chip positions. To that end, the spacers or spacing layers, which comprise a silicone composition, can be coated with adhesive.

For packaging the plurality of semiconductor chips with a plastic casting composition, this composition is potted in order to filled up the interstices among the semiconductor chips and to fill the voids between the semiconductor chips and the plastic intermediate substrate as well as the mounting frame. After that, the plastic intermediate substrate is sawn apart in the region of the plastic casting composition between the semiconductor chips, and the packaging of the electronic components is thus completed.

In the cutting operation, the saw blade is guided through the plastic casting composition, which essentially comprises silicone composition. In this cutting method, sticky deposits of sawing residues occur, such as silicone beads, and hence these deposits are removed mechanically in a further cleaning process. Such a cleaning process is cost-intensive and complicated. Moreover, without this mechanical cleaning process, the external dimensions and external shape of the housing remain undefined. In addition, in subsequent production steps, the sawing residues can drop off and contaminate devices downstream, such as testing pedestals. Furthermore, it has been found that a housing whose contact bump arrangement on the plastic intermediate substrate is substantially larger in its area than the semiconductor chip itself is extremely mechanically unstable, since the plastic intermediate substrate with the contact bumps typically comprises a flexible, metal-coated polyamide. Stabilizing the extremely unstable outer edge that protrudes past the semiconductor chip dimensions has been feasible until now, for this housing type, only by complicatedly applying individual housing frames, by a time-consuming and expensive method that demands increased precision.

SUMMARY OF THE INVENTION

The object of the present invention is therefore to disclose a device for packaging electronic components and a method for packaging such components that overcomes the above disadvantages when BGA housings on a plastic intermediate substrate are separated into individual components and that allows sawing in which no sticky deposits of sawing residues whatever can occur.

According to the invention, in addition to the semiconductor chips, a plastic grid is disposed on the plastic intermediate substrate, which grid surrounds each semiconductor chip in framelike fashion and which is provided for packaging the plurality of semiconductor chips with a plastic casting composition between semiconductor chips and the plastic grid. A device equipped in this way has the advantage that in the sawing process, the thermoplastic plastic casting composition no longer comes into contact with the saw blade and thus sticky residues or deposits, such as silicone beads if the potting composition comprises silicone, can form; instead, for cutting apart the device for packaging electronic components into individual electronic components, the saw blade can be guided through the plastic grid, so that it has no contact with the plastic casting composition whatever at the cut faces.

By the disposition of a plastic grid in a conventional mounting frame, so that the otherwise usual plastic casting composition is in part replaced by the plastic grid, on the one hand a considerable amount of plastic casting composition can be saved, and on the other, the previous devices for packaging electronic components can continue to be used without restriction.

Furthermore, with the device of the invention, time-consuming and expensive housing mounting with stabilizing individual frames is avoided, because these individual frames are created directly as the plastic grid is cut apart.

In a further preferred embodiment of the device for packaging electronic components, a mounting frame with a single large area opening for a plurality of semiconductor chip positions on the plastic intermediate substrate is replaced by a novel mounting frame, improved according to the invention, which has a plurality of individual openings that correspond in shape and size to the electronic components to be formed, so that in this embodiment of the invention, there is no need to produce and mount a plastic grid before the potting with a plastic casting composition is done.

The plastic intermediate substrate with its plurality of semiconductor chip positions can still be used as before for the improved mounting frame of the invention as well. This has the advantage that the design or construction of the plastic intermediate substrate with the semiconductor chip positions and the semiconductor chips disposed thereon, and their connections with the contact bumps via conductor tracks of the plastic intermediate substrate, can all be kept entirely as is. The advantage over a device with a single large-area opening is that when the plurality of electronic components are separated into individual BGA housings, the saw blades need no longer be guided through a plastic casting composition but instead are guided entirely within the material comprising the mounting frame. Thus with this version as well, the formation of sticky deposits in the cutting operation is averted.

In a preferred embodiment, the plastic casting composition is a thermoplastic silicone composition. This has the advantage that the differing thermal expansion behavior of the inner semiconductor chip and the outer plastic grid can be compensated for by the thermoplastic silicone composition, so that no stresses whatever are exerted on the protective frame, created from the plastic grid, or on the semiconductor chip located in the interior of the protective frame.

In a further preferred embodiment, the mounting frame comprises a dimensionally stable plastic. This has the advantage that the typically relatively flexible plastic intermediate substrate, by being glued to the mounting frame, offers a relatively stable device for packaging electronic components. The dimensionally stable plastic can preferably comprise polyethylene, polypropylene, polyamides or polycarbonates, polyvinyl chloride, or polytetrafluoroethylene, with suitable fillers.

In a further preferred embodiment, the mounting frame can also be made from a duroplastic, such as an epoxy resin or other two component plastics. Such plastics have the advantage that particularly in the sawing process, they do not form any thermoplastic, sticky residues or deposits but instead can be machined.

In a further preferred embodiment, the mounting frame and the plastic grid can be made from the same material, so that in the sawing operation, the same peripheral and starting conditions and the same sawing rates can be attained. In the preferred embodiment of the invention in which the mounting frame and the plastic grid are a one-piece, integral component, with openings for each semiconductor chip, as noted above, the mounting frame and the plastic grid are made from the very outset from the same material.

In another preferred embodiment of the invention, the semiconductor chip positions are disposed in rows and columns on the plastic intermediate substrate. This has the advantage that the cutting apart into individual electronic components can be done by simple linearly guided sawing of the device for packaging electronic components. All that is needed is that one saw cut be placed between the rows and columns of each of the semiconductor chip positions.

In a further preferred embodiment of the invention, the plastic intermediate substrate is bandlike, which has the advantage that individual strips are cut out of the band and can be connected to the dimensionally stable mounting frame in order to construct the device for packaging electronic components. The bandlike structure furthermore has the advantage that in mass production, both the application of the semiconductor chips to the intermediate substrate and the formation of contact bumps, preferably comprising balls of contact solder, can be done continuously and in a once-through process.

To that end, the plastic intermediate substrate is preferably made from a flexible polyamide with a metal coating structured to form conductor tracks. This flexible polyamide has a thickness of up to 100 $\mu$m, while the metal coating for the conductor tracks is between 0.3 $\mu$m and 5 $\mu$m thick.

In a further preferred embodiment of the invention, the plastic grid has longitudinal webs and transverse webs, which are wider than a saw blade width of a saw for cutting the semiconductor chip positions apart into individual packaged electronic components with contact bumps. The width of the transverse webs and the width of the longitudinal webs need not be the same, however; instead, they can certainly have different widths, as long as these widths are greater than the saw blade width when the semiconductor chip positions are cut apart, so that a wide enough protective edge for each electronic component can be created as the plurality of electronic components are separated into individual electronic components.

Preferably, the plastic grid of the device of the invention thus forms a protective frame around each of the plurality of semiconductor chips. Even if the plastic intermediate substrate carrying the plastic bumps is not substantially larger than the semiconductor chip, each electronic component that is packaged with the device of the invention is automatically provided with a protective frame, which is significant especially whenever the plastic intermediate substrate carrying the contact bumps is substantially larger that the semiconductor chip, because in that case, the protective frame created from the device according to the invention for packaging electronic components and surrounding each of the plurality of semiconductor chips takes on the task of stabilizing the resultant plastic housing. The accuracy and precision of the electronic components and their external dimensions do not depend on how accurately and precisely a single frame for an electronic component is disposed; instead, they are now dependent only on the precision of the severing saw cut through the plastic grid or the mounting frame with the plastic grid integrated in one piece.

The method for packaging electronic components depends with its method steps on whether a plastic grid according to the invention is disposed in a conventional mounting frame, or whether the plastic grid with the mounting frame according to the invention a newly constructed one-piece integral component with openings for each of the semiconductor chips.

Accordingly, the method according to the invention can be performed with different method steps.

In the one case, a conventional mounting frame with an opening for fitting in a striplike plastic intermediate substrate is furnished. To that end, the plastic intermediate substrate is furnished with a plurality of contact bump positions with connectable conductor tracks that lead to a plurality of semiconductor chip positions, and in these positions it has semiconductor chips whose contact faces are connected to the conductor tracks, while plastic spacers or spacing layers keep the plurality of semiconductor chips on the plastic intermediate substrate in the semiconductor chip positions. Once these two main parts of the device for packaging electronic components are furnished, the plurality of semiconductor chips are positioned in the opening of the mounting frame by application of the plastic intermediate substrate to the mounting frame. After that, a plastic grid of the invention is disposed on the plastic intermediate substrate, so that the plurality of semiconductor chips is surrounded in framelike fashion by the plastic grid. Next, the plurality of semiconductor chips is sealed by potting of the interstice with a plastic casting composition between semiconductor chips and the plastic grid and of all the voids between the semiconductor chip and the plastic intermediate substrate. Finally, the plastic grid is cut apart into individual protective frames, surrounding each semiconductor chip, forming a packaged electronic component with a dimensionally stable protective frame.

This method has the advantage that regardless of the size proportions between the semiconductor chip and the plastic intermediate substrate that carries the bumps, a stable protective frame is fundamentally formed around each of the resultant, packaged electronic components. Hence no sticky sawing residues occur at the housing edge, because of suitable grid material is selected for exact sawing and thus for an acccurate geometry.

If, for another preferred way of performing the method for packaging electronic components, a mounting frame with a plurality of openings for fitting in a plurality of semiconductor chips, carried by a plastic intermediate substrate at semiconductor chip positions, in the openings is furnished, then the furnished plastic intermediate substrate can be positioned in such a way that one semiconductor chip is disposed in each single opening of the mounting frame. After that, the packaging of the plurality of semiconductor chips is done by potting all the voids between the semiconductor chip and the plastic intermediate substrate. After the contact bumps have been applied in the contact bump positions, finally, a packaged electronic component with a protective frame is formed by cutting the mounting frame apart into individual protective frames, surrounding each semiconductor chip. The materials to be employed in the method of the invention as a casting composition, mounting frame, plastic grid or plastic intermediate substrate, are the same ones already mentioned above for the device according to the invention for packaging electronic components.

To that end, the mounting frame can be produced from a dimensionally stable plastic by means of an injection molding process, or can be cast by mixing two resin components to form a duroplastic in a suitable mold. Both methods are also suitable for producing the mounting frame and the plastic grid of the same material in one piece.

The plastic intermediate substrate of a flexible polyamide can be provided, by means of galvanic deposition, with a metal coating which is subsequently structured to form conductor tracks and contact terminal faces.

In the method and the device of the invention, the contact bumps can be preferably produced by melting solder contact beads.

Embodiments of the invention will now be described in further detail in conjunction with the accompanying drawings.

DESCRIPTION OF THE PREFERRED EMBODIMENT

Figure 1:
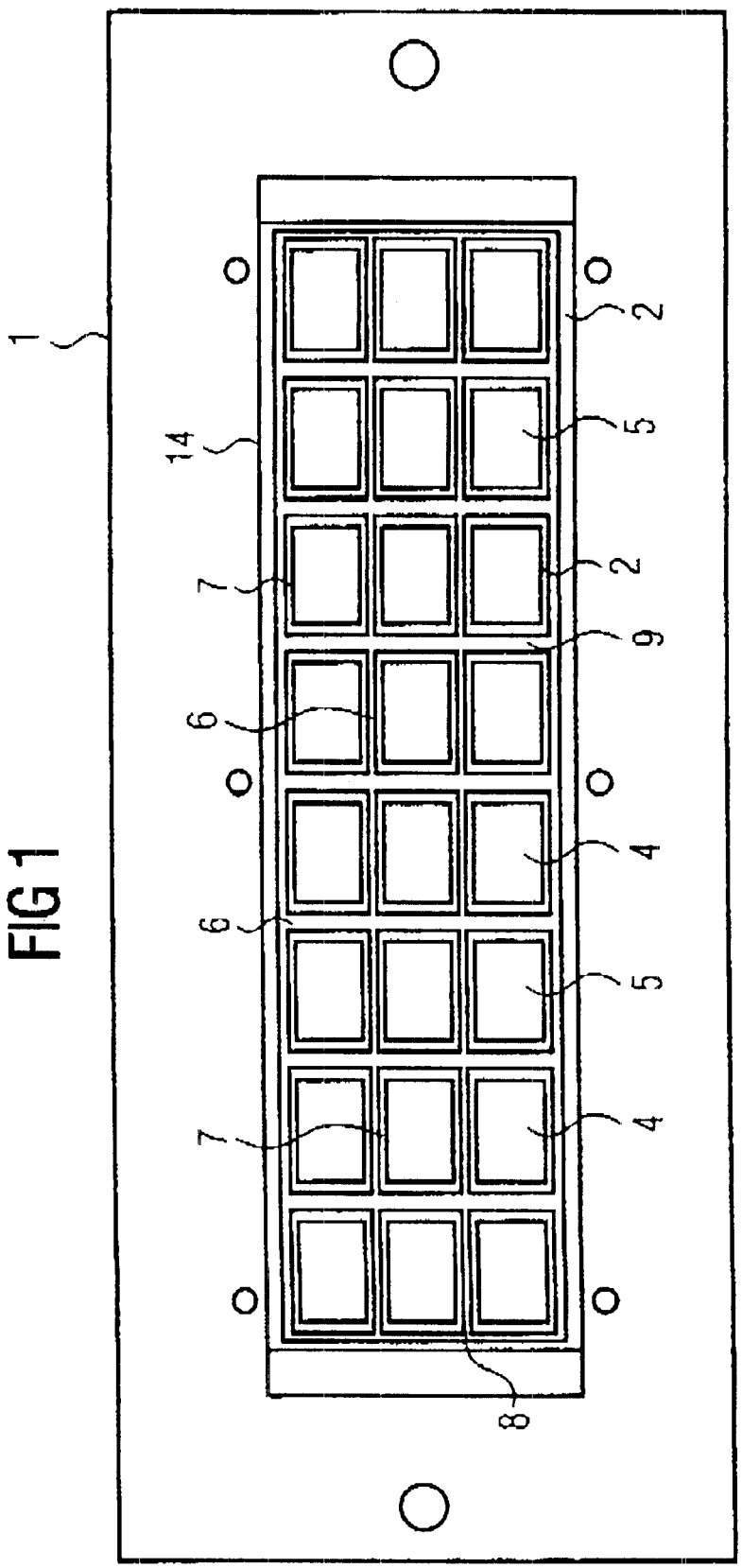
FIG. 1 shows a plan view of a device for packaging electronic components in a first embodiment of the invention.

FIG. 1 shows a plan view of a device for packaging electronic components in a first embodiment of the invention. In this version, for packaging electronic components, the device has a mounting frame 1, which surrounds a single large opening 14, which is filled by a plastic intermediate substrate 2 with a plurality of semiconductor chip positions 4 that are thus located inside the mounting frame. The plastic intermediate substrate is connected by its peripheral zones, not visible in FIG. 1, to the mounting frame.

The mounting frame substantially comprises a dimensionally stable plastic or a metal, which is capable of precisely holding and positioning a plastic intermediate substrate of flexible plastic material. The plastic intermediate substrate has a plurality of contact bumps, of the kind that can be seen in FIGS. 6–8, to which conductor tracks of a conductor track layer of the plastic intermediate substrate are connected. The conductor tracks lead to the plurality of semiconductor chip positions 4 inside the mounting frame 1, which have semiconductor chips 5. The contact faces of the semiconductor chips 5 are connected to the conductor tracks, and plastic spacers or spacing layers keep the semiconductor chips 5 fixed in the semiconductor chip positions 4 on the plastic intermediate substrate 2. Additionally on the plastic intermediate substrate 2, a plastic grid 6 is provided, which in framelike fashion surrounds each semiconductor chip 5 and which for packaging the plurality of semiconductor chips 5 is provided with a plastic casting composition 7 between semiconductor chips 5 and the plastic grid 6. In this embodiment, the plastic casting composition 7 is a thermoplastic silicone composition. The mounting frame 1 is made from a dimensionally stable plastic or a metal, so that the plastic intermediate substrate 2, constructed in bandlike fashion, can be retained in a stable position in the opening 14 of the mounting frame 1.

Figure 2:
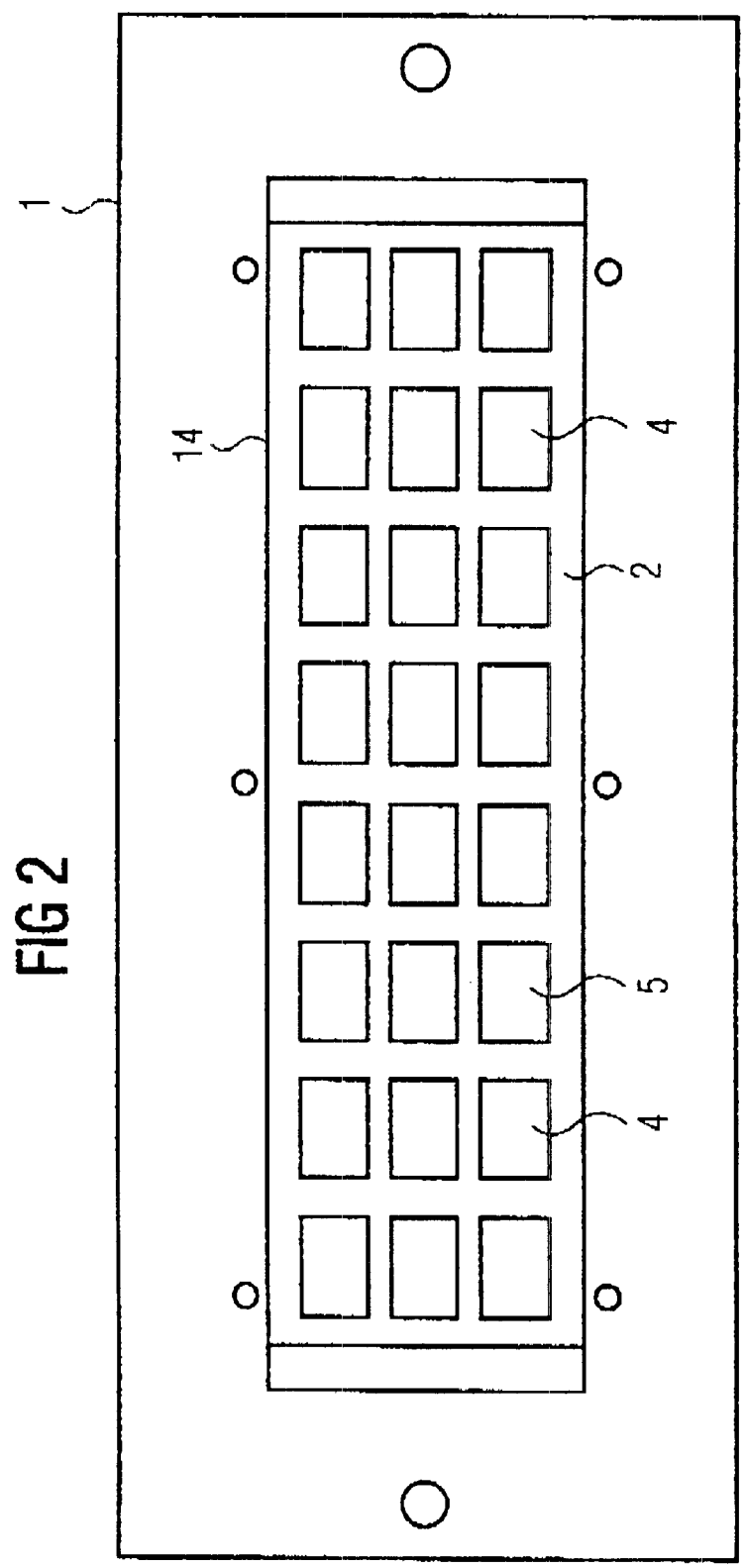
FIG. 2 shows a plan view on a mounting frame with a positioned plastic intermediate substrate which carries a plurality of semiconductor chips.

FIG. 2 shows a plan view on a mounting frame 1 with a positioned plastic intermediate substrate 2 which carries a plurality of semiconductor chips 5. In this state of assembly of the device for packaging electronic components, the plastic grid of the invention, which can be seen in FIG. 1, has not yet been installed, so that the arrangement of the semiconductor chip positions 4 in rows and columns in the opening 14 of the mounting frame 1 can be seen.

Figure 3:
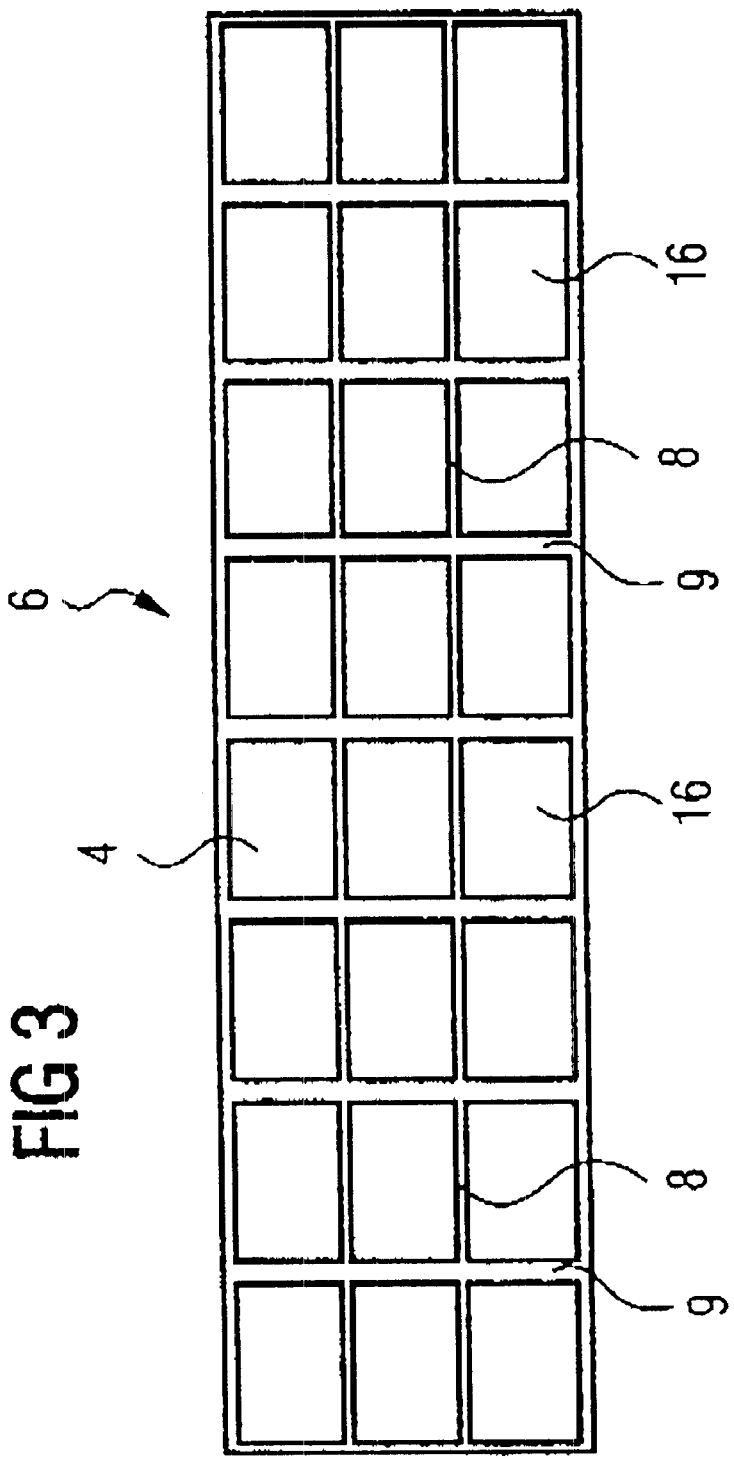
FIG. 3 shows a plan view of a plastic grid that is used in the first embodiment of the invention shown in FIG. 1.
Figure 7:
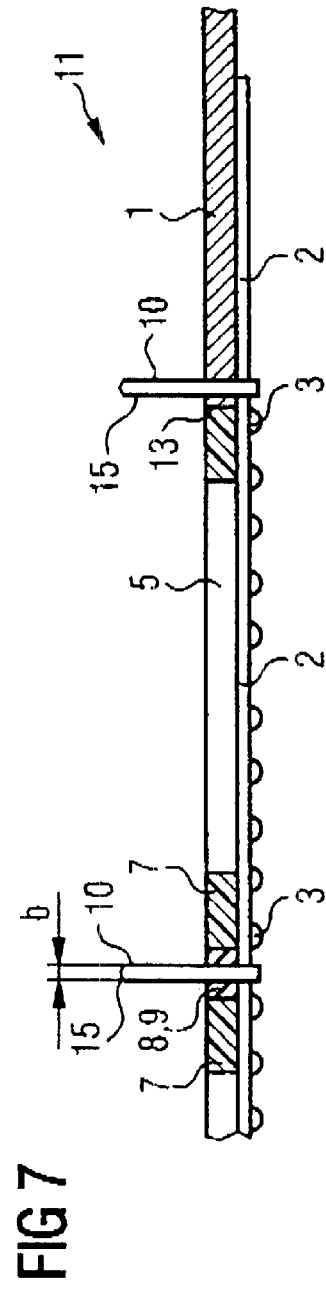
FIG. 7 shows a cross section through the second embodiment of FIG. 6, with saw blades that in the cutting step separate the electronic components.

FIG. 3 shows a plan view of a plastic grid 6 that is used in the first embodiment of the invention shown in FIG. 1, and on the basis of the disposition of semiconductor chip positions 4 in rows and columns, the plastic grid is made up of transverse webs and longitudinal webs 8 and 9, respectively. The width of the webs is greater than the saw blade width b, which is shown in FIG. 7. The transverse webs and longitudinal webs 8 and 9 of the plastic grid leave openings 16 free, which in their outer dimensions are larger than the dimensions of the semiconductor chips 5 at the semiconductor chip positions 4. Thus the plastic grid for packaging electronic components can be positioned on the plastic intermediate substrate 2, which is shown in FIGS. 1 and 2. Thus some of the plastic casting composition 7 for packaging electronic components is replaced by the plastic grid 6. At the same time, by means of the plastic grid it can be assured that the saw blades no longer have to saw through a thermoplastic silicone composition, as in the prior art; instead, the saw blades can be guided through the material comprising the plastic grid 6, so that no sticky or beadlike thermoplastic deposits whatever require mechanical removal by an additional cleaning process. To that end, a plastic material for the plastic grid 6 is used that can be machined at increased sawing speed, without melting. Along with the advantages of the sawing speed as mentioned, because of the use of the plastic grid of the invention, at the same time the process time and hence the expense for separating the device for packaging electronic components into individual electronic components are reduced.

Figure 4:
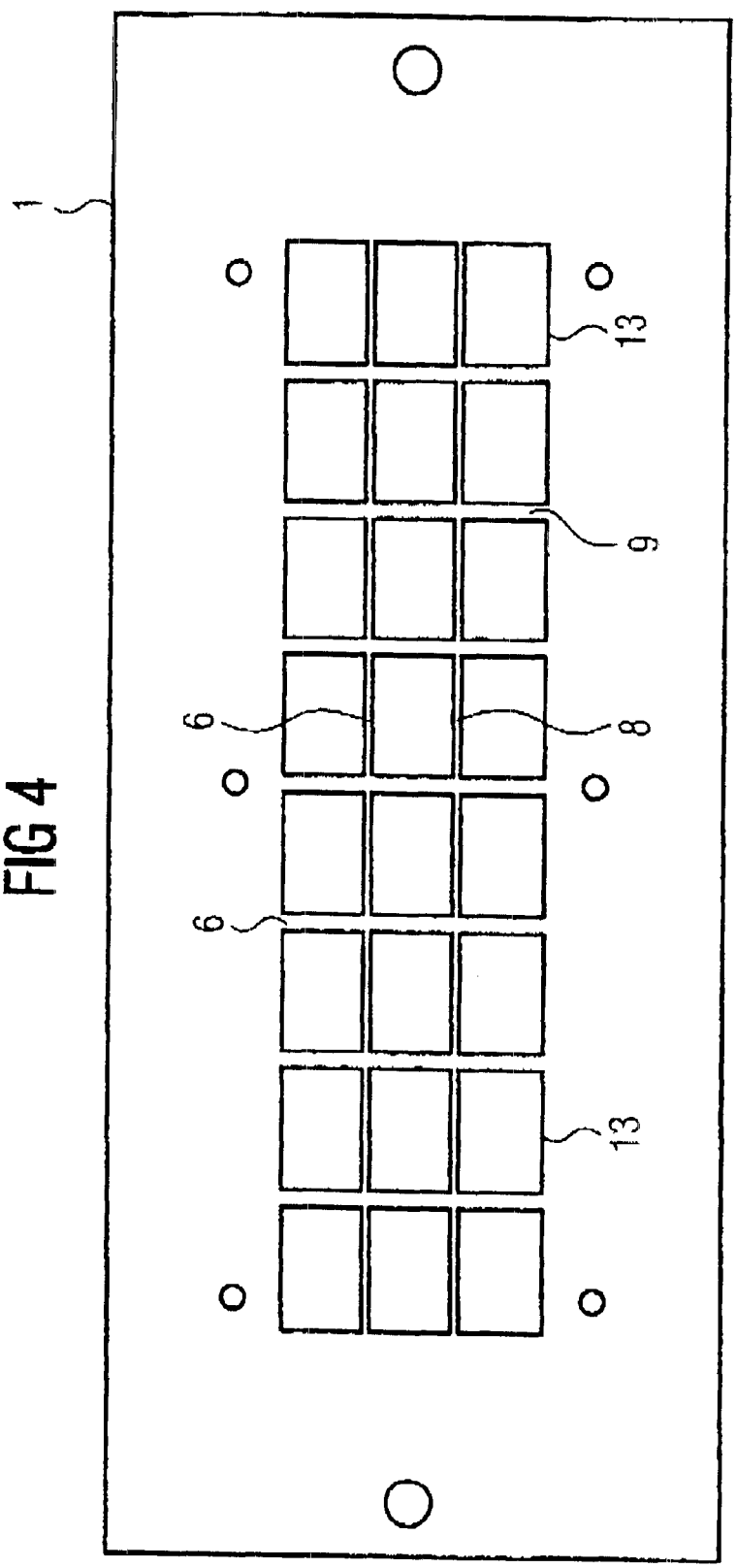
FIG. 4 shows a plan view on a mounting frame of a second embodiment of the invention for packaging electronic components.

FIG. 4 shows a plan view on a mounting frame 1 of a second embodiment of the invention. If an improved mounting frame 1 is to be constructed for new constructions, then it can form a one-piece, integral component with the plastic grid 6 of the invention. To that end, in a second preferred embodiment of the invention, as shown in FIG. 4, a plurality of openings is provided in the mounting frame 1; in their dimensions, these openings correspond to the dimensions of the semiconductor chips 5, as FIG. 5 shows.

Figure 5:
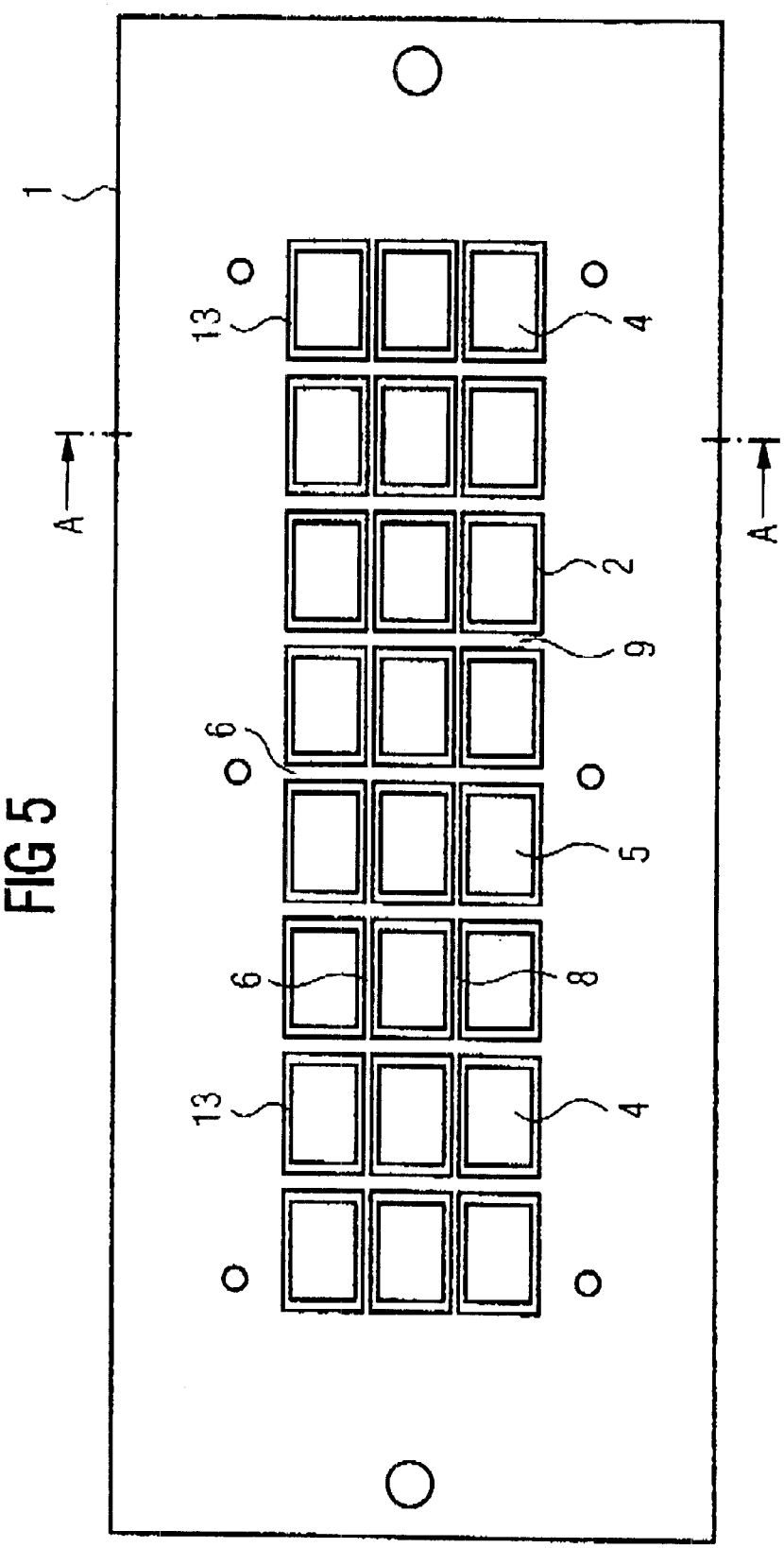
FIG. 5 shows a plan view of the mounting frame of FIG. 4, with a plurality of positioned semiconductor chips in a plurality of openings of the mounting frame.

FIG. 5 shows a plan view of the mounting frame 1 of FIG. 4, with a plurality of positioned semiconductor chips 5 in a plurality of openings 13 of the mounting frame 1. The plastic intermediate substrate 2 in FIG. 5 is essentially concealed by the mounting frame 1 shown in FIG. 4. Only the semiconductor chips 5 of the plastic intermediate substrate can be seen in their position inside the plurality of openings 13 in the mounting frame 1.

Figure 6:
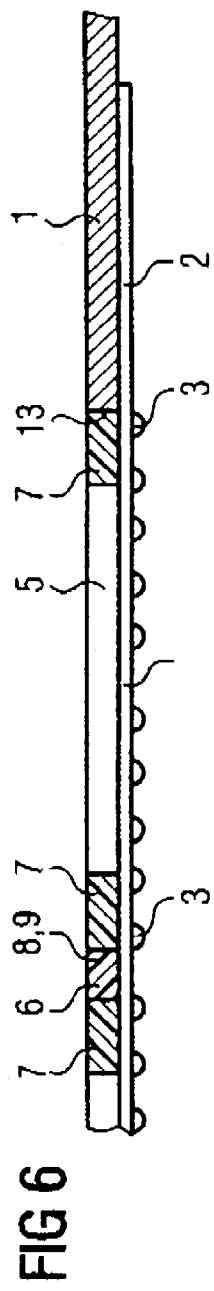
FIG. 6 shows a detail of the second embodiment of the invention, after the plastic casting composition has been introduced, in a cross section taken along the line A—A of FIG. 5.

FIG. 6 shows a cross section of the second embodiment of the invention, after the plastic casting composition 7 has been introduced, in a cross section taken along the line A—A of FIG. 5. The mounting frame 1 and the plastic grid 6 in this embodiment are of the same material, and they form a one-piece, integral component which each opening 13 surrounds one semiconductor chip 5. The plastic intermediate substrate 2 with its bumps 3 and with the conductor tracks 4, not shown, carries the semiconductor chip 5, and the interstice between the semiconductor chip 5, mounting frame 1 or plastic grid 6 and plastic intermediate substrate 2 is filled with plastic casting composition 7, which in this embodiment comprises a silicone composition.

FIG. 7 shows a cross section through the second embodiment of FIG. 6, with was blades 15 that in the cutting step separate the electronic components 11. The saw blade with b is less than the web width of the webs 8, 9, so that in the sawing step, a protective frame 12 as shown in FIG. 8 is created.

Figure 8:
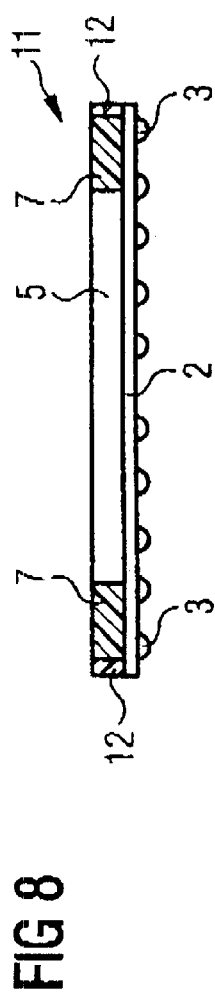
FIG. 8 shows the cross section through the second embodiment of FIG. 6, after the cutting step.

FIG. 8 shows the cross section through the second embodiment of FIG. 6, after the cutting step. After this step separated electronic components 11 are created, with a housing which is reinforced by a plastic frame 12 and from which the contact bumps 3 protrude and which entirely surrounds the semiconductor chip 5 in its peripheral region with plastic casting composition 7. By the potting of the device for packaging electronic components with a plastic casting composition in a vacuum, it is at the same time assured that all the voids between the semiconductor chip 5 and the plastic intermediate substrate 2 will be filled with the plastic casting composition 7, so that a dimensionally stable electronic component can be manufactured.

We claim:

1. A device for packaging electronic components, comprising:

a plurality of semiconductor chips having contact faces;

a plastic intermediate substrate defining a plurality of semiconductor chip positions for receiving said plurality of semiconductor chips, said semiconductor chip positions being disposed in rows and columns on said plastic intermediate substrate, said plastic intermediate substrate having a plurality of contact bumps and conductor tracks connected to said plurality of contact bumps, said conductor tracks leading to said plurality of semiconductor chip positions and connected to said contact faces of said plurality of semiconductor chips;

a mounting frame framing and retaining said plastic intermediate substrate;

a plastic grid disposed on said plastic intermediate substrate, said plastic grid surrounding each one of said plurality of semiconductor chips in a framelike fashion, said plastic grid being formed with longitudinal webs and transverse webs, said longitudinal webs and transverse webs having widths being wider than a saw blade width of a saw for separating said semiconductor chip positions into individual packaged electronic components including said contact bumps; and a plastic casting composition disposed between said plurality of semiconductor chips and said plastic grid.

2. The device according to claim 1, wherein said plastic casting composition is a thermoplastic silicone composition.

3. The device according to claim 2, wherein said mounting frame is made from a material selected from the group consisting of a dimensionally stable plastic and a metal.

4. The device according to claim 1, wherein said mounting frame is made from a material selected from the group consisting of a dimensionally stable plastic and a metal.

5. The device according to claim 1, wherein said mounting frame is made from a duroplastic.

6. The device according to claim 1, wherein said mounting frame and said plastic grid are made from a common material.

7. The device according to claim 1, wherein said plastic intermediate substrate is bandlike.

8. The device according to claim 1, wherein said plastic intermediate substrate is made from a flexible polyamide with a metal coating structured to form said conductor tracks.

9. The device according to claim 1, wherein said plastic grid forms a protective frame around each individual one of said plurality of said semiconductor chips.

10. The device according to claim 1, wherein said mounting frame and said plastic grid are formed together as a one-piece, integral component with openings for each one of said plurality of said semiconductor chips.

* * * * *